United States Patent
Minamio et al.

(10) Patent No.: US 6,674,154 B2
(45) Date of Patent: Jan. 6, 2004

(54) LEAD FRAME WITH MULTIPLE ROWS OF EXTERNAL TERMINALS

(75) Inventors: Masanori Minamio, Takatsuki (JP); Toru Nomura, Amagasaki (JP); Fumihiko Kawai, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 56 days.

(21) Appl. No.: 10/083,311

(22) Filed: Feb. 27, 2002

(65) Prior Publication Data

US 2002/0121670 A1 Sep. 5, 2002

(30) Foreign Application Priority Data

Mar. 1, 2001 (JP) ........................................ 2001-056522

(51) Int. Cl.$^7$ .............................................. H01L 23/48
(52) U.S. Cl. ...................................... 257/666; 174/255
(58) Field of Search ............................... 257/666, 678, 257/676, 786; 174/257, 260

(56) References Cited

U.S. PATENT DOCUMENTS

| | | | | |
|---|---|---|---|---|
| 5,652,461 A | * | 7/1997 | Ootsuki et al. | 257/675 |
| 6,348,726 B1 | * | 2/2002 | Bayan et al. | 257/666 |
| 6,388,311 B1 | * | 5/2002 | Nakashima et al. | 257/676 |
| 6,455,348 B1 | * | 9/2002 | Yamaguchi | 438/106 |

FOREIGN PATENT DOCUMENTS

| | | |
|---|---|---|
| JP | 08250641 A | 9/1996 |
| JP | 10256460 A | 9/1998 |
| JP | 2000196004 A | 7/2000 |

* cited by examiner

Primary Examiner—David L. Talbott
Assistant Examiner—Lourdes Cruz
(74) Attorney, Agent, or Firm—Nixon & Peabody, LLP

(57) ABSTRACT

A lead frame includes a die pad, a suspension lead and a plurality of leads. The group of leads include at least three kinds of leads, including first, second and third leads. While the first lead and the third lead are connected to each other upon production of the lead frame, a connecting portion therebetween has a smaller thickness than that of the frame body so that the first lead and the third lead can be separated from each other in a subsequent step.

6 Claims, 14 Drawing Sheets

LEAD FRAME WITH MULTIPLE ROWS OF EXTERNAL TERMINALS

BACKGROUND OF THE INVENTION

The present invention relates to a lead frame for use in a land grid array (LGA) type resin-encapsulated semiconductor device.

In recent years, a resin-encapsulated semiconductor device of a type called "QFN" (quad flat non-leaded package) has been developed in the art, in which an encapsulation resin is provided substantially only on the upper side of a lead frame (i.e., the lead frame is molded on one side), in an attempt to realize a small and thin resin-encapsulated semiconductor device. A conventional QFN type resin-encapsulated semiconductor device in which a die pad is exposed on the reverse surface of the package will now be described.

FIG. 11 is a cross-sectional view illustrating a conventional QFN type resin-encapsulated semiconductor device. FIG. 12 is a plan view illustrating a lead frame used in the conventional QFN type resin-encapsulated semiconductor device. As illustrated in FIG. 12, the lead frame used in the conventional resin-encapsulated semiconductor device includes an outer frame 107, or a frame body, having an opening therein, a rectangular die pad 101 placed substantially in the center of the opening, suspension leads 108 each having one end connected to a corner of the die pad 101 and the other end connected to the outer frame 107 for supporting the die pad 101, and a plurality of inner leads 103 each extending toward the corresponding side of the die pad 101. The conventional QFN type resin-encapsulated semiconductor device (package) includes the die pad 101, the suspension leads 108 and the inner leads 103 of the lead frame, a semiconductor chip 102 bonded on the die pad 101 of the lead frame, thin metal wires 104 electrically connecting electrodes of the semiconductor chip 102 with some of the inner leads 103, and an encapsulation resin 105 encapsulating the semiconductor chip 102, the inner leads 103, the thin metal wires 104, the suspension leads 108 and the die pad 101 together on the upper side of the lead frame. Note however that the reverse surface of the die pad 101, and the reverse surface and the outer side surface of each inner lead 103 are not covered with the encapsulation resin 105 but are exposed on the reverse surface or the side surface of the package. The reverse surface portion and the outer side surface portion of each inner lead 103 function as an external terminal 106.

Note that although FIG. 12 only shows, as a unit, a region of the lead frame on which one semiconductor chip is mounted, the entire lead frame actually includes a plurality of such units as illustrated in FIG. 12 that are arranged next to each other in a matrix pattern.

Next, a method for manufacturing the conventional QFN type resin-encapsulated semiconductor device will be described. FIGS. 13A to 13D are cross-sectional views taken along line XIII—XIII of FIG. 12, illustrating the method for manufacturing the conventional resin-encapsulated semiconductor device.

First, in the step of FIG. 13A, a lead frame as illustrated in FIG. 12 is prepared, including the die pad 101 on which the semiconductor chip is mounted, suspension leads (not shown) for supporting the die pad 101, and the inner leads 103 each extending toward the corresponding side of the die pad 101 (see FIG. 11).

Next, in the step of FIG. 13B, the reverse surface of the semiconductor chip 102 is bonded on the upper surface of the die pad 101 via an adhesive, and the semiconductor chip 102 is mounted on the die pad 101 of the lead frame.

Next, in the step of FIG. 13C, the semiconductor chip 102 and a bonding region of the upper surface of each inner lead 103 are electrically connected to each other via the thin metal wire 104.

Then, in the step of FIG. 13D, the lead frame having a number of semiconductor chips mounted thereon is set in an encapsulation mold set, with a sheet material (not shown) being closely held on an upper mold or a lower mold of the encapsulation mold set, and a resin encapsulation process is performed, whereby the semiconductor chip 102, the inner leads 103, the thin metal wires 104, the suspension leads 108 and the die pad 101 are encapsulated in the encapsulation resin 105 on the upper side of the lead frame. At this time, the reverse surfaces of the die pad 101 and each inner lead 103 are exposed, i.e., not covered with the encapsulation resin 105. Then, the lead frame is cut along the side surface of the encapsulation resin 105 so as to be divided into individual packages. In each package (resin-encapsulated semiconductor device), the reverse surface portion and the outer side surface portion of each inner lead 103 function as an external terminal 106.

Although the above-described conventional QFN type resin-encapsulated semiconductor device has an innovative structure as a small and thin semiconductor device, there is much to be improved in order to accommodate a further increase in the number of pins of a semiconductor chip to be mounted and a further reduction in size. In view of this, an LGA type resin-encapsulated semiconductor device has been recently proposed in the art, in which external terminals are provided in two rows on the reverse surface of a package, in order to further reduce the size of the device and to increase the number of external terminals.

FIGS. 14A to 14C are an top view, a bottom view and a cross-sectional view taken along line XIVc—XIVc, respectively, each illustrating an LGA type resin-encapsulated semiconductor device proposed in the prior art. FIG. 15 is a plan view illustrating a lead frame used in the LGA type resin-encapsulated semiconductor device. As illustrated in FIG. 15, the lead frame used in the conventional resin-encapsulated semiconductor device includes an outer frame 107, or a frame body, having an opening therein, a rectangular die pad 101 placed substantially in the center of the opening, suspension leads 108 each having one end connected to a corner of the die pad 101 and the other end connected to the outer frame 107 for supporting the die pad 101, a plurality of first inner leads 103a each extending toward the corresponding side of the die pad 101, and a plurality of second inner leads 103b each extending to a position closer to the die pad 101 than the first inner leads 103a.

As illustrated in FIGS. 14A to 14C, the LGA type resin-encapsulated semiconductor device (package) includes a semiconductor chip 102 bonded on the die pad 101, the first and second inner leads 103a and 103b, thin metal wires 104 electrically connecting the semiconductor chip 102 with the first and second inner leads 103a and 103b, and an encapsulation resin 105 encapsulating the semiconductor chip 102, the inner leads 103a and 103b, the thin metal wires 104, the suspension leads (not shown) and the die pad 101 together on the upper side of the lead frame. Note however that the reverse surface of the die pad 101, the outer side surface and the reverse surface of each first inner lead 103a, the outer side surface of each second inner lead 103b, and the reverse surface of the tip portion of each second inner lead 103b are not covered with the encapsulation resin 105 but are exposed on the side surface or the reverse surface of the package. The reverse surface and the outer side surface of each first inner lead 103a, which are exposed respectively on the reverse surface and the side surface of the package, function as a first external terminal 106a. The reverse surface of each second inner lead 103b, which is exposed on the reverse surface of the package at a position closer to the die pad 101 than the first external terminal 106a, functions as a second external terminal 106b. Note that a lower portion of each second inner lead 103b is removed through a half-etching process except for the tip portion thereof, so that the second inner lead 103b has a reduced thickness in the half-etched portion.

Note that although FIG. 15 only shows, as a unit, a region of the lead frame on which one semiconductor chip is mounted, the entire lead frame actually includes a plurality of such units as illustrated in FIG. 15 that are arranged next to each other in a matrix pattern.

Next, a method for manufacturing the conventional LGA type resin-encapsulated semiconductor device will be described. FIGS. 16A to 16D are cross-sectional views taken along line XVI—XVI of FIG. 15, illustrating the method for manufacturing the resin-encapsulated semiconductor device.

First, in the step of FIG. 16A, a lead frame is prepared, including the die pad 101 on which the semiconductor chip is mounted, the first inner leads 103a each extending toward the corresponding side of the die pad 101, and the second inner leads 103b each extending to a position closer to the die pad 101 than the first inner leads 103a (see FIG. 15).

Next, in the step of FIG. 16B, the semiconductor chip 102 is bonded and mounted on the die pad 101 of the lead frame via an adhesive.

Next, in the step of FIG. 16C, the semiconductor chip 102 and a bonding region of the upper surface of each of the first and second inner leads 103a and 103b are electrically connected to each other via the thin metal wire 104.

Then, in the step of FIG. 16D, the lead frame having a number of semiconductor chips mounted thereon is set in an encapsulation mold set, with a sheet material (not shown) being closely held on an upper mold or a lower mold of the encapsulation mold set, and a resin encapsulation process is performed, whereby the semiconductor chip 102, the inner leads 103a and 103b, the thin metal wires 104, the suspension leads 108 and the die pad 101 are encapsulated in the encapsulation resin 105 on the upper side of the lead frame. At this time, the reverse surface of the die pad 101, the reverse surface and the outer side surface of each first inner lead 103a, the reverse surface of the tip portion of each second inner lead 103b, and the outer side surface of each second inner lead 103b are exposed, i.e., not covered with the encapsulation resin 105. Then, the lead frame is cut along the side surface of the encapsulation resin 105 so as to be divided into individual packages. In each package (resin-encapsulated semiconductor device), the reverse surface portion and the outer side surface portion of each first inner lead 103a function as the first external terminal 106a. The reverse surface portion of the tip portion of each second inner lead 103b, which is at a position closer to the die pad 101 than the first external terminal 106a, functions as the second external terminal 106b.

Although the above-described conventional QFN type resin-encapsulated semiconductor device has a reduced size and a reduced thickness, it has not been sufficient for accommodating a further increase in the number of pins.

While the above-described conventional LGA type resin-encapsulated semiconductor device accommodates an increased number of pins and has two rows of external terminals, there is a demand for such devices with more than two rows of external terminals. LGA type resin-encapsulated semiconductor devices having three or more rows of external terminals have encountered other problems caused by the increased number of rows of external terminals.

In order to increase the efficiency of the manufacturing process, an LGA type resin-encapsulated semiconductor device having three or more rows of external terminals is manufactured by the following process, for example. That is, a plurality of units each including a chip mounted thereon are provided in a single lead frame, and the entire surface of the lead frame is resin-encapsulated at once by using an encapsulation resin such as an epoxy resin, after which the encapsulated lead frame is cut by a rotating blade such as a dicer into individual packages (resin-encapsulated semiconductor devices) each including a chip. In the step of dividing the lead frame, which has been resin-encapsulated at once, into pieces by using the rotating blade, stripping may occur at the interface between the leads and the encapsulation resin, thus lowering the reliability of the product. Even after the encapsulated lead frame is divided into individual packages (resin-encapsulated semiconductor devices) by using the rotating blade, stripping may occur at the interface between the leads and the encapsulation resin when a stress is applied to a resin-encapsulated semiconductor device, thus lowering the reliability of the product.

SUMMARY OF THE INVENTION

An object of the present invention is to provide a lead frame used for producing a resin-encapsulated semiconductor device having three or more rows of lands (external terminals) on the reverse side of the resin-encapsulated semiconductor device.

A lead frame of the present invention includes: a frame body made of a conductive material and including at least one opening for mounting a semiconductor chip; a die pad placed in the opening of the frame body; and a group of leads extending from the frame body into the opening. The group of leads include at least: a first lead connected to the frame body and including a first bonding pad provided on an upper surface of the first lead and a first land provided on a lower surface of the first lead; a second lead connected to the frame body and including a second bonding pad provided on an upper surface of the second lead and a second land provided on a lower surface of the second lead; and a third lead connected to the first lead and including a third bonding pad provided on an upper surface of the third lead and a third land provided on a lower surface of the third lead. A connecting portion that is thinner than the lead frame body and that can be punched through is provided between the first lead and the third lead.

In this way, upon production of the lead frame, the third lead is connected to the frame body and is supported by the frame body. Then, the connecting portion is punched through in a subsequent step, whereby the first lead and the third lead can be used while being electrically separated from each other. Therefore, a large number of lands, i.e., the first, second and third lands, can be used as external terminals without increasing the number of leads that are connected to the periphery of the opening. Thus, it is possible to obtain a lead frame useful for producing a semiconductor device having three or more rows of external terminals.

At least the second lead may include a neck portion having a smaller width than other portions as viewed in a plan view. In this way, when the first, second and third leads are incorporated in a resin-encapsulated semiconductor device, the leads and the encapsulation resin contact each other over an increased contact area at the neck portion, whereby even if stripping occurs between the leads and the encapsulation resin, the progress of the stripping can be suppressed.

Each lead may include a region around the bonding pad thereof that has a smaller thickness than that of a portion of the lead corresponding to the bonding pad, with a stepped portion being provided between the bonding pad and the region around the bonding pad. Also in this way, the progress of the stripping between the leads and the encapsulation resin can be suppressed.

The first, second and third lands may be substantially coplanar on a common plane while being arranged in three rows on the common plane.

It is preferred that the second lead and a lead structure including the first and third leads are arranged alternately along a periphery of the opening of the frame body.

It is preferred that the frame body, the die pad and the group of leads are made of a single metal plate.

DESCRIPTION OF THE PREFERRED EMBODIMENT

A lead frame, a resin-encapsulated semiconductor device using the same, and a method for manufacturing the same, according to an embodiment of the present invention will now be described with reference to the drawings.

Lead Frame

First, a lead frame according to an embodiment of the present invention will be described.

Figure 1:
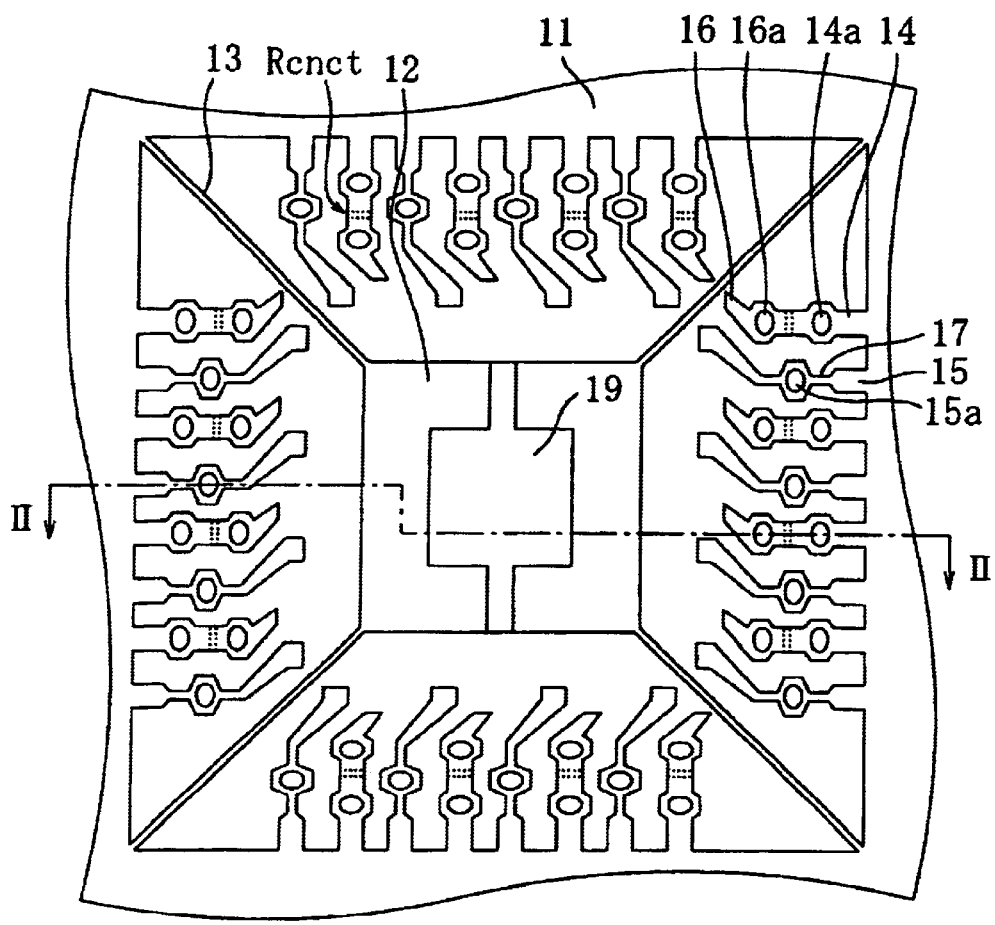
FIG. 1 is a plan view illustrating a lead frame according to an embodiment of the present invention.
Figure 2:
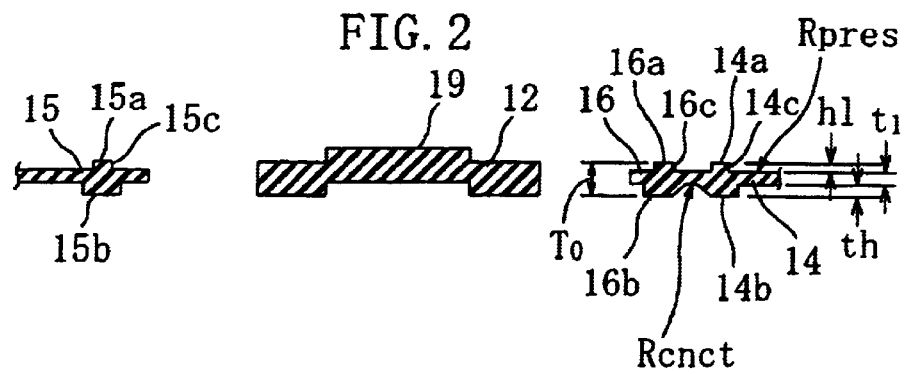
FIG. 2 is a cross-sectional view illustrating the same taken alone line II—II of FIG. 1.

FIG. 1 is a plan view illustrating a lead frame according to the embodiment of the present invention. FIG. 2 is a cross-sectional view taken along line II—II of FIG. 1. 3A and 3B are a plan view and a cross-sectional view taken along line IIIb—IIIb, respectively, illustrating a main portion of the lead frame of the present embodiment.

As illustrated in FIG. 1, the lead frame of the present embodiment includes a frame body 11 (outer frame) made of a metal plate that contains copper (Cu) as its main component. The frame body 11 includes a number of openings in each of which a semiconductor chip is provided. FIG. 1 shows only a portion of the lead frame corresponding to one opening, for the sake of simplicity. The lead frame includes, in each opening, a die pad 12 on which a semiconductor chip is mounted, suspension leads 13 each having one end supporting a corner of the die pad 12 and the other end connected to the frame body 11, and a group of leads each having a tip portion extending toward the corresponding side of the die pad 12 and a base portion connected to the frame body 11. The frame body 11, the die pad 12, the suspension leads 13 and the group of leads are produced from a single metal plate.

The group of leads include at least three kinds of leads, i.e., first, second and third leads 14, 15 and 16. A first bonding pad 14a is provided on the upper surface of each first lead 14, and a first land 14b, opposing the first bonding pad 14a, is provided on the lower surface of the first lead 14. A second bonding pad 15a is provided on the upper surface of each second lead 15, and a second land 15b, opposing the second bonding pad 15a, is provided on the lower surface of the second lead 15. A third bonding pad 16a is provided on the upper surface of each third lead 16, and a third land 16b, opposing the third bonding pad 16a, is provided on the lower surface of the third lead 16.

Moreover, a region of each of the leads 14, 15 and 16 excluding the bonding pads 14a, 15a and 16a and the lands 14b, 15b and 16b is a pressed region Rpres whose thickness is reduced through a pressing process as illustrated in FIG.

2. The bonding pads 14*a*, 15*a* and 16*a* respectively include stepped portions 14*c*, 15*c* and 16*c* protruding upwardly from the press regions Rpres having a reduced thickness. The lands 14*b*, 15*b* and 16*b*, as viewed in a plan view on the lower surface of the lead frame, are arrayed in three rows as will be described later, and the lands 14*b*, 15*b* and 16*b* function as external terminals when a resin-encapsulated semiconductor device (package) is produced.

The thickness t0 (see FIG. 2) of the frame body 11 is about 150 $\mu$m to about 200 $\mu$m, for example, and the thickness of each of the leads 14, 15 and 16 from the upper surface of the bonding pad to the lower surface of the land is also t0. The thickness t1 (see FIG. 2) of the pressed region Rpres of each of the leads 14, 15 and 16, i.e., the region excluding the bonding pad and the land, is about 80 $\mu$m to about 120 $\mu$m, for example, the height h1 by which each of the bonding pads 14*a*, 15*a* and 16*a* protrudes from the pressed region Rpres is about 5 $\mu$m to about 50 $\mu$m, for example, and the height h2 by which each of the lands 14*b*, 15*b* and 16*b* protrudes from the pressed region Rpres is about 50 $\mu$m to about 120 $\mu$m, for example.

A first feature of the present embodiment is that while the first lead 14 and the third lead 16 are connected to each other upon production of the lead frame, the thickness of the connecting portion Rcnct therebetween is smaller than the thickness of the frame body 11 so that the first lead 14 and the third lead 16 can be separated from each other in a subsequent step. The thickness of the connecting portion Rcnct between the first lead 14 and the third lead 16 is about 70 $\mu$m, for example, and the width thereof is about 100 $\mu$m, for example. A portion of the connecting portion Rcnct indicated by a dotted line in FIG. 1 is punched through in a subsequent step so as to electrically separate the first lead 14 and the third lead 16 from each other.

In the lead frame of the present embodiment, the first lead 14 and the third lead 16 can be separated from each other in a step after attachment of the lead frame to an encapsulation sheet and before die bonding or wire bonding is performed, or in a step after the attachment of the lead frame to the encapsulation sheet (following the die bonding or wire bonding) and before the resin encapsulation step. Thus, the first lead 14 and the third lead 16 are separated from each other in a subsequent step. In this way, it is possible to increase the number of lands to be external terminals without increasing the number of leads that are connected to the periphery of the opening of the frame body 11, whereby it is possible to obtain a lead frame that is advantageous in the production of a resin-encapsulated semiconductor device having three or more rows of external terminals.

In a case where the first lead 14 and the third lead 16 are separated from each other by a process of punching through the connecting portion Rcnct therebetween using a punch while the lead frame is attached to the encapsulation sheet, the connecting portion Rcnct needs to be punched through with a punching force such that the entire lead frame is not stripped from the encapsulation sheet. In a case where such a process is employed and the main component of the lead frame is copper as in the present embodiment, it is preferred that the width of the connecting portion Rcnct is in the range of 40 $\mu$m to 100 $\mu$m, and the thickness thereof is in the range of 80 $\mu$m to 120 $\mu$m.

Moreover, a second feature of the present embodiment is that the second lead 15 includes a neck portion 17 that has a reduced width in the vicinity of the second land 15*b*. The width of the neck portion 17 is about 40 $\mu$m to about 100 $\mu$m, for example.

Furthermore, although not shown, a reinforced land having a larger area than other lands (functioning as external terminals) is provided in the vicinity of the base end of each suspension lead 13. Therefore, after the resin-encapsulated semiconductor device is produced through the resin encapsulation step, a reinforced land is exposed on the reverse surface of the device at each corner thereof, thereby realizing a structure with an increased secondary mounting reliability, i.e., the reliability of the device when it is mounted on a mother board.

Moreover, a protruding portion 19 that is protruding from the other portions is provided in a central portion of the die pad 12 by a press, or the like, so that a semiconductor chip is mounted on the protruding portion 19.

Moreover, since the die pad 12 includes the protruding portion 19 that is protruding upwardly in the area of the upper surface thereof, when a semiconductor chip is mounted, the semiconductor chip will be supported by a spot-float structure. Since the semiconductor chip is lifted up, external terminals can also be provided below the semiconductor chip. Moreover, in the resin encapsulation step, the encapsulation resin can be placed between the reverse surface of the semiconductor chip and the die pad 12 or below the protruding portion 19, thereby further increasing the reliability.

Furthermore, a metal plating layer is formed across the entire surface of the lead frame of the present embodiment. The lead frame of the present embodiment includes a base body whose main component is copper (Cu) and a triple metal plating layer provided on the base body. The metal plating layer includes a nickel (Ni) layer, a palladium (Pd) layer and a gold (Au) layer.

The leads on which the plating layer has been formed are subjected to a pressing process so as to form the stepped portions 14*c*, 15*c* and 16*c* on the bonding pads. After the pressing process, the composition of the plating layer in the pressed region Rpres around the area defined by each of the stepped portions 14*c*, 15*c* and 16*c* is different from that of the region inside the area defined by each of the stepped portions 14*c*, 15*c* and 16*c* (including the bonding pads 14*a*, 15*a* and 16*a*) because different portions receive different pressing forces from the pressing process. Particularly, an outermost surface portion may have a reduced proportion of the gold layer, which has a good adherence to the encapsulation resin, and an increased proportion of the palladium layer and the nickel layer, which have a poor adherence to the encapsulation resin. Moreover, as the leads are subjected to a pressing process, the irregularities on the surface of the plating layer may be eliminated in the pressed portions, thereby deteriorating the adherence. However, if the stepped portions 14*c*, 15*c* and 16*c* are formed by pressing only the pressed region Rpres around the bonding pads 14*a*, 15*a* and 16*a*, the pressing force is not applied in the region inside the area defined by each of the stepped portions 14*c*, 15*c* and 16*c*, and thus the composition of the plating layer does not change in the area, whereby it is possible to maintain a resin adherence that the plating layer originally has. Therefore, even if stripping occurs at the interface between the encapsulation resin and the leads, and proceeds to the stepped portions 14*c*, 15*c* and 16*c*, the stripping can be stopped before it reaches the region inside the area defined by each of the stepped portions 14*c*, 15*c* and 16*c*.

Specifically, when the stepped portions 14*c* to 16*c* are formed by pressing the leads 14 to 16, the pressing process is performed by using a press die having a cavity corresponding to each region inside the area defined by each of the stepped portions 14*c* to 16*c* of the leads 14 to 16 so that only the region around the bonding pads 14*a* to 16*a* of the leads 14 to 16 is pressed while the pressing force is not applied on the region inside the area defined by each of the stepped portions 14c to 16c (including the bonding pads 14a to 16a). In this way, only the region around the bonding pads 14a to 16a of the leads 14 to 16 can be pressed, whereby the resin adherence of the bonding pads 14a to 16a can be maintained.

Thus, the bonding pads 14a to 16a of the leads 14 to 16 of the lead frame of the present embodiment are protruding from the pressed region Rpres around the bonding pads 14a to 16a whose thickness has been reduced through the pressing process, with the stepped portions 14c to 16c being formed between the bonding pads 14a to 16a and the pressed region Rpres. Therefore, the bonding pads 14a to 16a have a resin adherence that the plating layer originally has.

While the metal plating layer of the lead frame of the present embodiment has a multilayer structure including a nickel (Ni) layer, a palladium (Pd) layer and a gold (Au) layer, the metal plating layer may alternatively be a single metal plating layer such as a silver plating layer, a gold plating layer, or a solder plating layer.

By plating the lead frame before the pressing process as in the present embodiment, there is an advantage that the flow condition of the plating solution is more uniform across the lead frame surface, as compared with a case where the lead frame is plated after the pressing process.

Figure 3A:
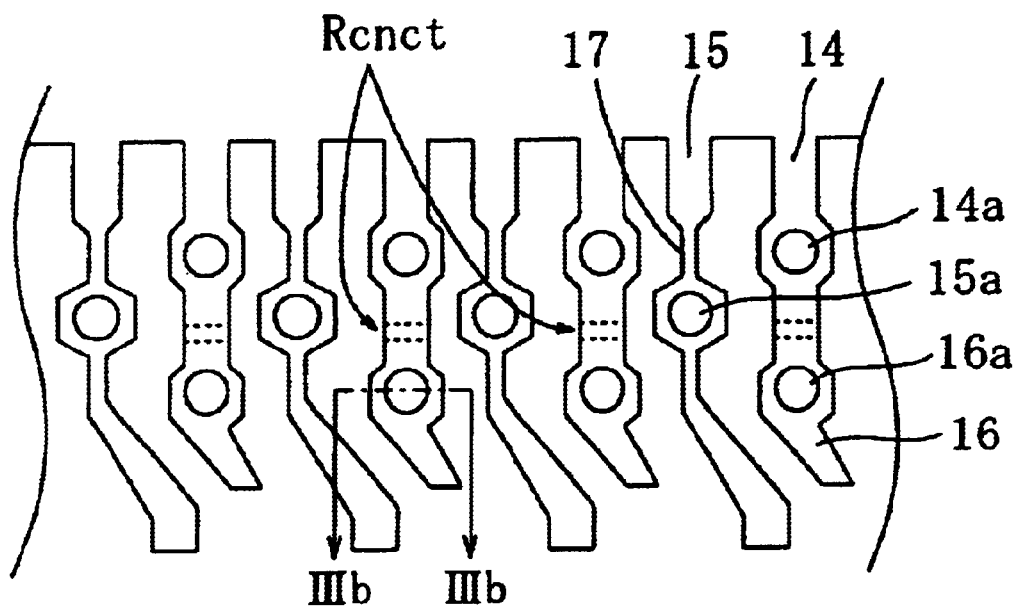
FIGS. 3A and 3B are a plan view and a cross-sectional view taken along line IIIb—IIIb, respectively, illustrating a main portion of the lead frame according to an embodiment of the present invention.
Figure 3B:
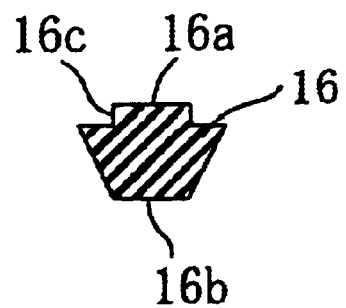

Moreover, as illustrated in FIG. 3B, the first lead 14, the second lead 15 and the third lead 16 have a tapered cross section, with the lower surface (reverse surface) of the bonding pad being exposed on the encapsulation resin surface to function as an external terminal after the resin encapsulation step.

Furthermore, since the second lead 15 includes the neck portion 17, the second lead 15 contacts the encapsulation resin over an increased contact area even if a stress is applied on the leads 14 to 16, thereby causing stripping at the interface between the leads 14 to 16 and the encapsulation resin during or after the manufacture of a resin-encapsulated semiconductor device using the lead frame. Therefore, it is possible to reduce the thermal stress and the mechanical stress, and to stop the progress of the stripping. In order for the stripping to progress past the neck portion 17, a greater stress is required since the width of the second lead 15 increases from the neck portion 17. Therefore, the stripping is suppressed from progressing inward past the neck portion 17. Thus, by providing the neck portion 17 in the second lead 15, it is possible to realize a resin-encapsulated semiconductor device resistant to stripping.

Furthermore, since the stepped portions 14c to 16c are formed around the bonding pads 14a to 16a, which are provided on the upper surfaces of the leads 14 to 16, respectively, the stepped portions 14c to 16c function to stop the progress of the stripping at the interface between the leads 14 to 16 and the encapsulation resin. Therefore, the stepped portions 14c to 16c, together with the neck portion 17 of the second lead 15, provide a synergistic effect of stopping the progress of the stripping between the encapsulation resin and the leads.

Resin-encapsulated Semiconductor Device

Next, a resin-encapsulated semiconductor device using the lead frame of the present embodiment will be described.

Figure 4A:
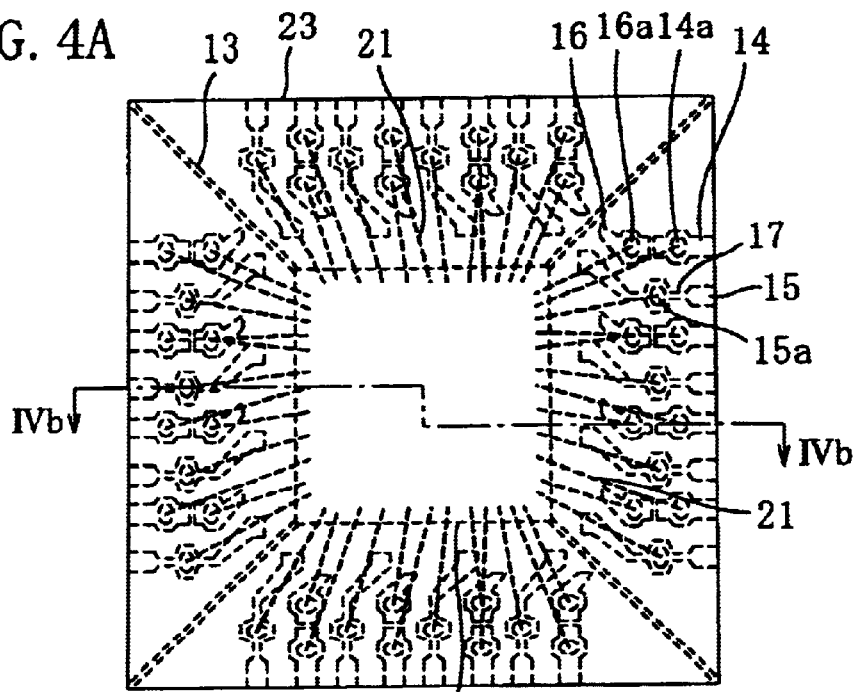
FIGS. 4A, 4B and 4C are a top view, a cross-sectional view taken along line IV—IV and a bottom view, respectively, illustrating a resin-encapsulated semiconductor device according to an embodiment of the present invention.
Figure 4B:
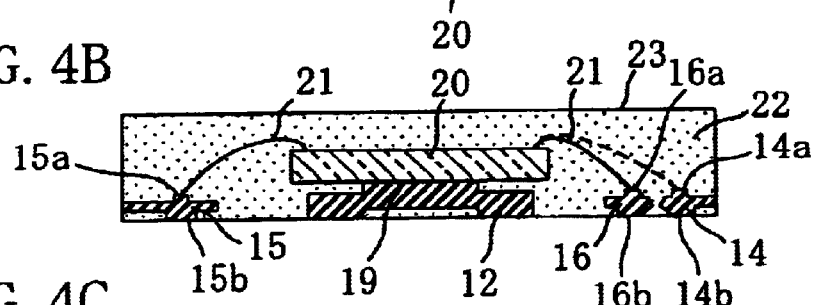
Figure 4C:
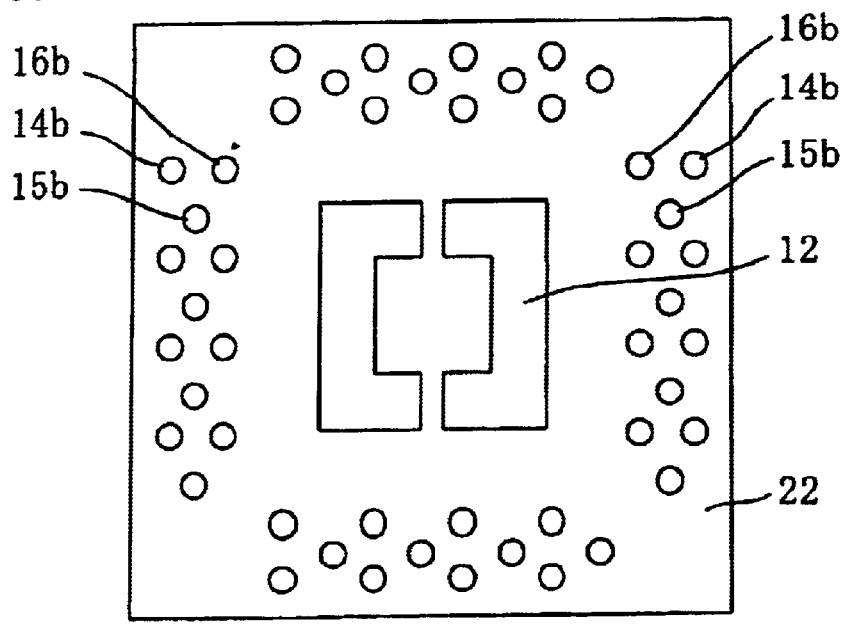

FIGS. 4A to 4C are a top view, a cross-sectional view taken along line IV—IV and a bottom view, respectively, illustrating the resin-encapsulated semiconductor device of the present embodiment. In FIG. 4A, components that are encapsulated in an encapsulation resin are illustrated by broken lines.

As illustrated in FIGS. 4A to 4C, the resin-encapsulated semiconductor device of the present embodiment includes the rectangular die pad 12, the suspension leads 13 for supporting the die pad 12, a semiconductor chip 20 mounted on the die pad 12 with the lower surface thereof being bonded on the upper surface of the die pad 12 via an adhesive, a group of leads including the first to third leads 14 to 16 each extending toward the corresponding side of the die pad 12, thin metal wires 21 electrically connecting electrodes of the semiconductor chip 20 with the bonding pads 14a to 16a of the leads 14 to 16 among the group of leads, and an encapsulation resin 22 encapsulating the semiconductor chip 20, the leads 14 to 16, the thin metal wires 21, the suspension leads 13 and the die pad 12 together on the upper side of the lead frame. Note however that the reverse surface of the die pad 12, the lands 14b to 16b on the reverse surface of the leads 14 to 16, and the outer side surface of each of the first and second leads 14 and 15 are not covered with the encapsulation resin 22 but are exposed on the reverse surface of the package (resin-encapsulated semiconductor device). The exposed lands 14b to 16b of the leads 14 to 16 function as external terminals.

The structure of each of the leads 14 to 16 is as described above in the description of the structure of the lead frame. Specifically, the group of leads include at least three kinds of leads, i.e., the first, second and third leads 14, 15 and 16. The first bonding pad 14a, to which the thin metal wire 21 is connected, is provided on the upper surface of each first lead 14, and the first land 14b, which is exposed on the lower surface of the encapsulation resin 22 and functions as an external terminal, is provided on the lower surface of the first lead 14. The second bonding pad 15a, to which the thin metal wire 21 is connected, is provided on the upper surface of the second lead 15, and the second land 15b, which is exposed on the lower surface of the encapsulation resin 22 and functions as an external terminal, is provided on the lower surface of the second lead 15. The third bonding pad 16a, to which the thin metal wire 21 is connected, is provided on the upper surface of the third lead 16, and the third land 16b, which is exposed on the lower surface of the encapsulation resin 22 and functions as an external terminal, is provided on the lower surface of the third lead 16.

The first lead 14 and the third lead 16 are electrically and physically separated from each other. Note that even if a portion of the first lead 14 and a portion of the third lead 16 are connected to each other via a very thin line such that the connection has a very high electric resistance to substantially block signals passing therethrough, it can be said that they are electrically separated from each other. On the other hand, in a resin-encapsulated semiconductor device that handles high frequency signals, it is preferred that the first lead 14 and the third lead 16 are separated from each other by a distance such that crosstalk does not occur therebetween. While one end of the first lead 14 is exposed on the side surface of the package (or the encapsulation resin 22), both ends of the third lead 16 are buried in the encapsulation resin 22 without reaching the side surface of the package. By providing a lead that has both ends buried in the encapsulation resin, as does the third lead, it is possible to increase the number of lands that function as external terminals without increasing the number of leads that reach the side surface of the encapsulation resin, whereby it is possible to easily obtain a resin-encapsulated semiconductor device having three or more rows of external terminals.

Moreover, the second lead 15 includes the neck portion 17 having a reduced width in the vicinity of the second land 15b. The width of the neck portion 17 is about 40 $\mu$m to 100 $\mu$m, for example.

The first to third bonding pads 14a to 16a are protruding upwardly from the pressed region Rpres having a reduced thickness, with the stepped portions 14c to 16c existing between the pressed region Rpres and the bonding pads 14a to 16a.

Moreover, the first to third lands 14b to 16b are provided in a planar arrangement forming three rows in an area of the lower surface of the encapsulation resin 22 (see FIG. 4C). Thus, the resin-encapsulated semiconductor device of the present embodiment is an LGA type resin-encapsulated semiconductor device having three rows of external terminals.

The resin-encapsulated semiconductor device of the present embodiment employs the lead frame described above, and therefore provides the following effects as already described above.

First, the first and third leads 14 and 16, which are connected to each other when the lead frame is produced, are separated from each other in a subsequent step, whereby a number of rows of lands can easily be provided without reducing the dimension between leads that are next to each other. For example, if a lead that is separated into two leads in a subsequent step is provided instead of the second lead 15, it is possible to obtain a resin-encapsulated semiconductor device having four rows of external terminals.

Furthermore, the second lead 15 includes the neck portion 17, whereby the width of the second lead 15 is reduced at the neck portion 17. Therefore, the second lead 15 contacts the encapsulation resin over an increased contact area even if a stress is applied on the leads 14 to 16, thereby causing stripping at the interface between the leads 14 to 16 and the encapsulation resin 22 during or after the manufacture of a resin-encapsulated semiconductor device using the lead frame. Therefore, it is possible to reduce the thermal stress and the mechanical stress, and to stop the progress of the stripping. In order for the stripping to progress past the neck portion 17, a greater stress is required since the width of the second lead 15 increases from the neck portion 17. Therefore, the stripping is suppressed from progressing inward past the neck portion 17. Thus, by providing the neck portion 17 in the second lead 15, it is possible to realize a resin-encapsulated semiconductor device resistant to stripping.

Furthermore, since the stepped portions 14c to 16c are formed around the bonding pads 14a to 16a, which are provided on the upper surfaces of the leads 14 to 16, respectively, the stepped portions 14c to 16c function to stop the progress of the stripping at the interface between the leads 14 to 16 and the encapsulation resin 22. Therefore, the stepped portions 14c to 16c, together with the neck portion 17 of the second lead 15, provide a synergistic effect of stopping the progress of the stripping between the encapsulation resin and the leads.

Next, a method for manufacturing the resin-encapsulated semiconductor device of the present embodiment will be described with reference to FIGS. 5A and 5B to 10A and 10B.

Figure 5A:
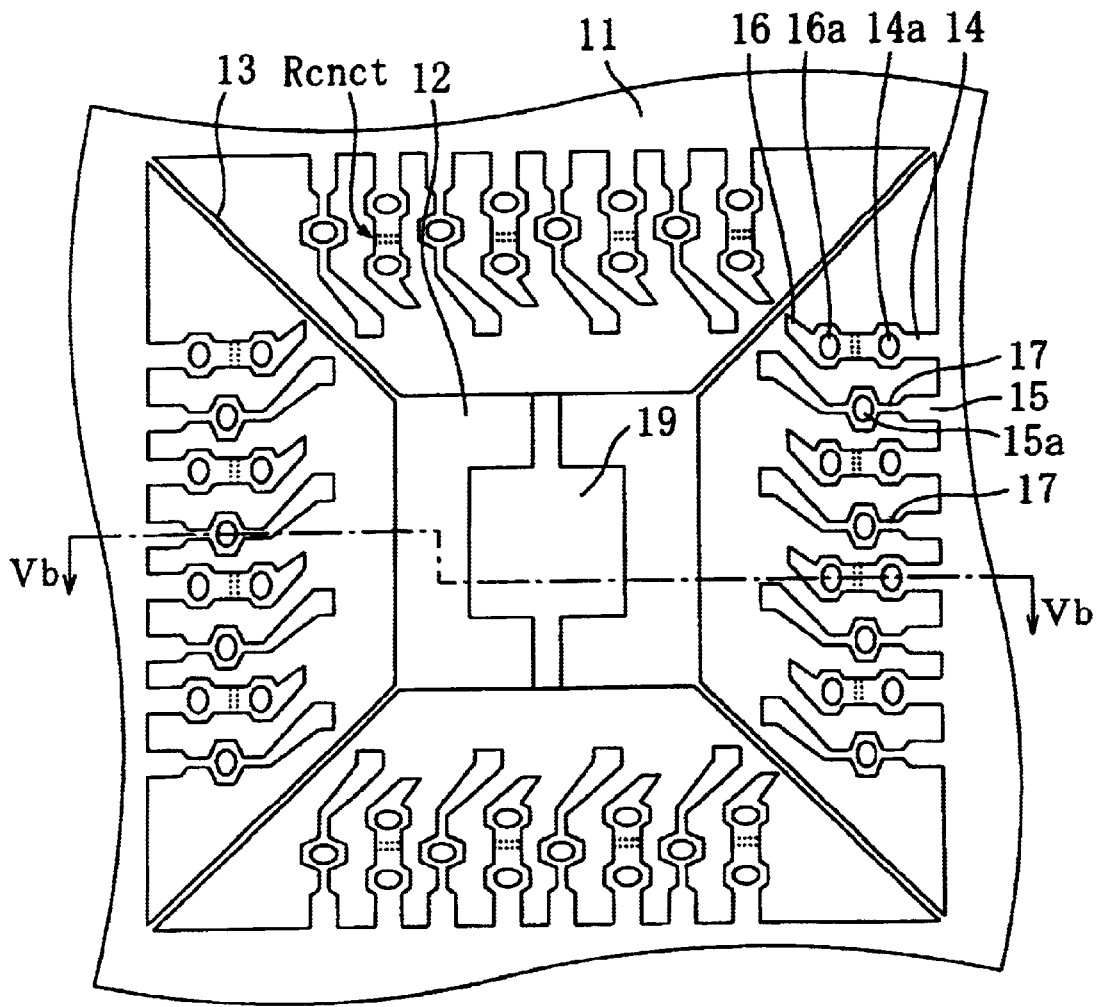
FIGS. 5A and 5B are a plan view and a cross-sectional view taken along line V—V, respectively, illustrating the step of preparing a lead frame according to an embodiment of the present invention.
Figure 5B:
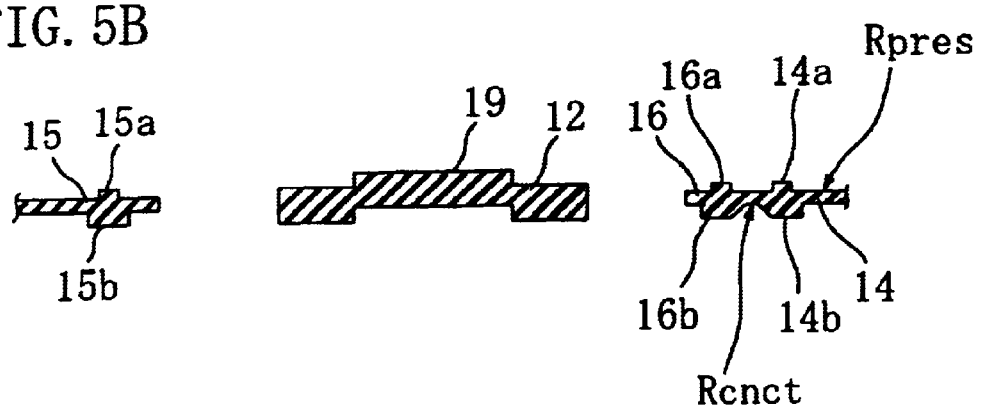

FIGS. 5A and 5B are a plan view and a cross-sectional view taken along line V—V, respectively, illustrating the step of preparing a lead frame. First, in the step of FIGS. 5A and 5B, a lead frame is prepared. Specifically, a lead frame to be prepared in this step includes the frame body 11 (outer frame) made of a metal plate that contains copper (Cu) as its main component, the die pad 12 placed in an opening of the lead frame for mounting a semiconductor chip thereon, the suspension leads 13 each having one end supporting a corner of the die pad 12 and the other end connected to the frame body 11, and a group of leads each having a tip portion extending toward the corresponding side of the die pad 12 and a base portion connected to the frame body 11. The first bonding pad 14a is provided on the upper surface of the first lead 14, among the group of leads, and the first land 14b, opposing the first bonding pad 14a, is provided on the lower surface of the first lead 14. The second bonding pad 15a is provided on the upper surface of the second lead 15, among the group of leads, and the second land 15b, opposing the second bonding pad 15a, is provided on the lower surface of the second lead 15. The third bonding pad 16a is provided on the upper surface of the third lead 16, among the group of leads, and the third land 16b, opposing the third bonding pad 16a, is provided on the lower surface of the third lead 16.

Moreover, a region of each of the leads 14, 15 and 16 excluding the bonding pads 14a, 15a and 16a and the lands 14b, 15b and 16b is a pressed region Rpres whose thickness is reduced through a pressing process. The bonding pads 14a, 15a and 16a respectively include the stepped portions 14c, 15c and 16c protruding upwardly from the press regions Rpres having a reduced thickness.

While the first lead 14 and the third lead 16 are connected to each other upon production of the lead frame, the thickness of the connecting portion Rcnct therebetween is reduced so that the first lead 14 and the third lead 16 can be separated from each other in a subsequent step.

Although FIGS. 5A and 5B only show, as a unit, a region of the lead frame on which one semiconductor chip is mounted, the entire lead frame actually includes a plurality of such units as illustrated in FIGS. 5A and 5B that are arranged next to each other in a matrix pattern.

Figure 6A:
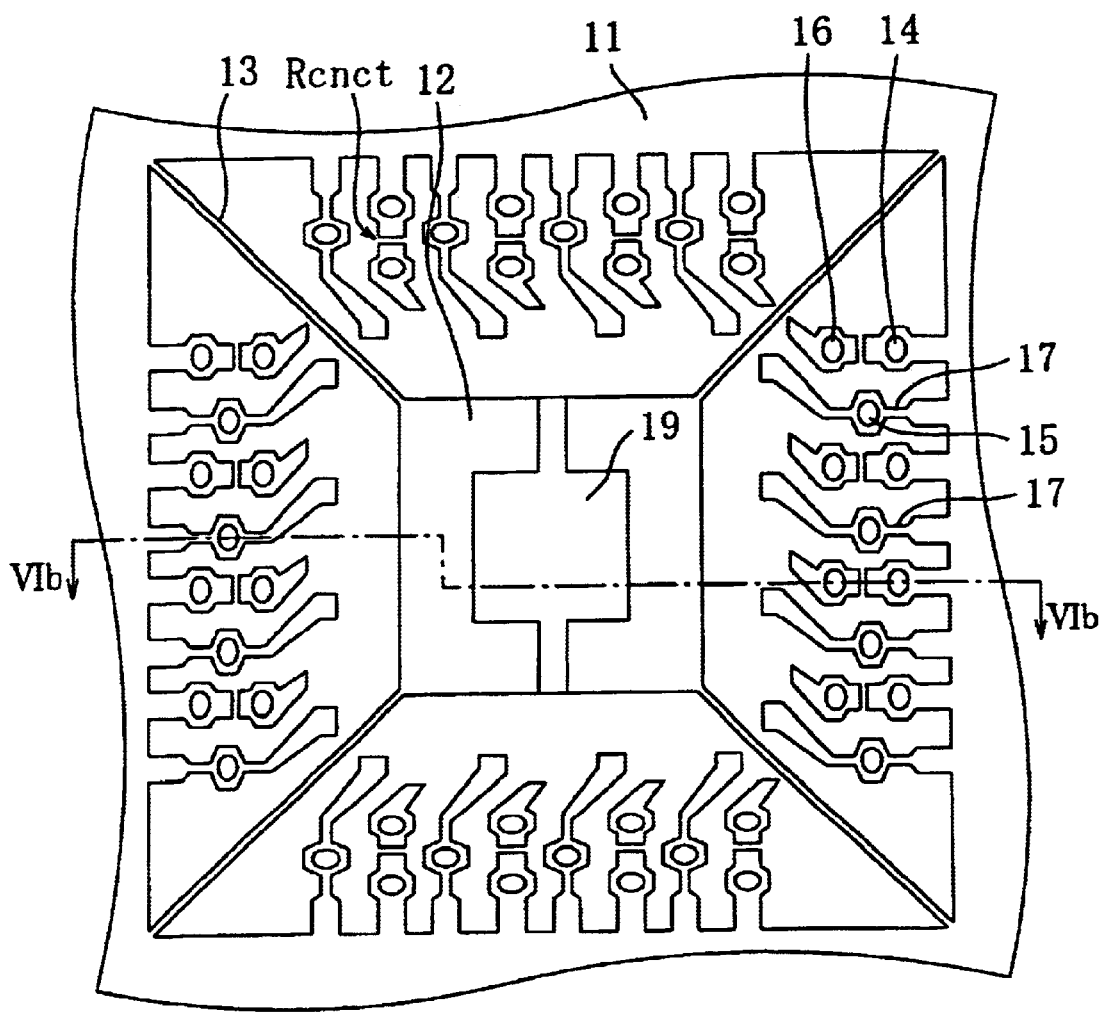
FIGS. 6A and 6B are a plan view and a cross-sectional view taken along line VI—VI, respectively, illustrating the step of cutting a connecting portion between a first lead and a third lead according to an embodiment of the present invention.
Figure 6B:
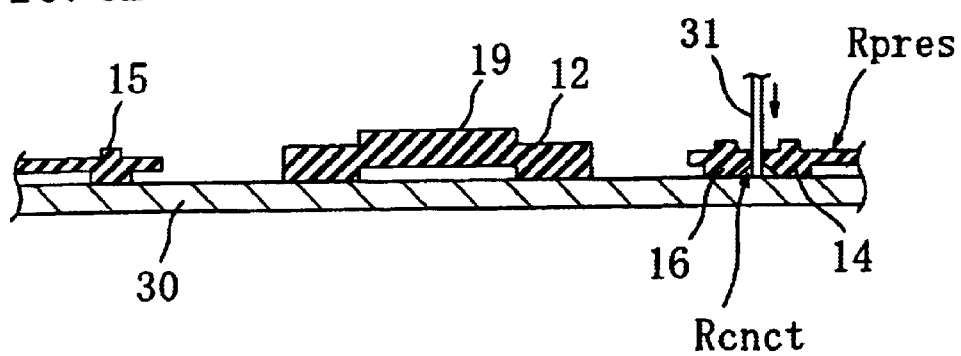

FIGS. 6A and 6B are a plan view and a cross-sectional view taken along line VI—VI, respectively, illustrating the step of cutting a connecting portion between the first and third leads 14 and 16. In the step illustrated in FIGS. 6A and 6B, an encapsulation sheet 30 is attached to the lower surface of the lead frame, and each connecting portion Rcnct between the first lead 14 and the third lead 16 is punched through using a punch 31 in each opening of the lead frame, thereby electrically separating the first and third leads 14 and 16 from each other. The encapsulation sheet 30 may be made of a polyimide resin and an adhesive, and has a thickness of about 5 $\mu$m to about 100 $\mu$m.

Figure 7A:
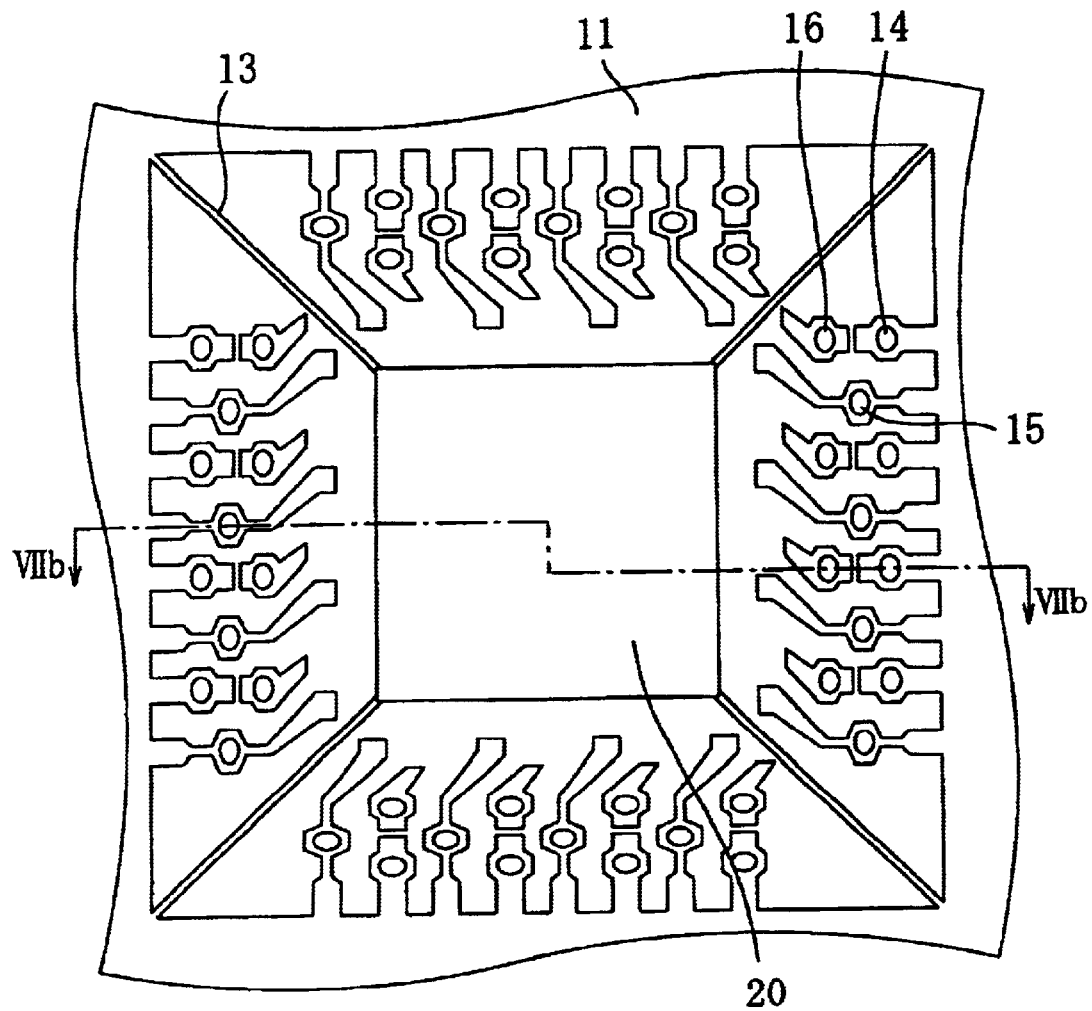
FIGS. 7A and 7B are a plan view and a cross-sectional view taken along line VII—VII, respectively, illustrating the die bonding step according to an embodiment of the present invention.
Figure 7B:
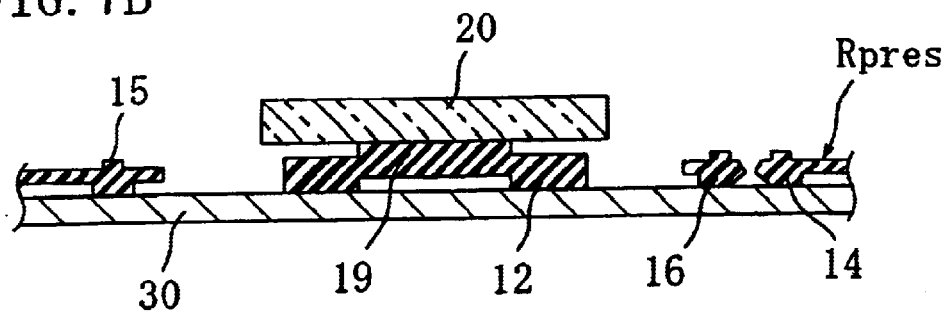

FIGS. 7A and 7B are a plan view and a cross-sectional view taken along line VII—VII, respectively, illustrating the die bonding step. In the step illustrated in FIGS. 7A and 7B, the upper surface of the protruding portion of the die pad 12 and the lower surface of the semiconductor chip 20 are bonded together via an adhesive while the lead frame is attached to the encapsulation sheet 30, thus mounting the semiconductor chip 20 on the die pad 12. Since the protruding portion 19 is provided in the die pad 12, there is a gap between the lower surface of the semiconductor chip 20 and the die pad 12 beside the protruding portion 19.

Figure 8A:
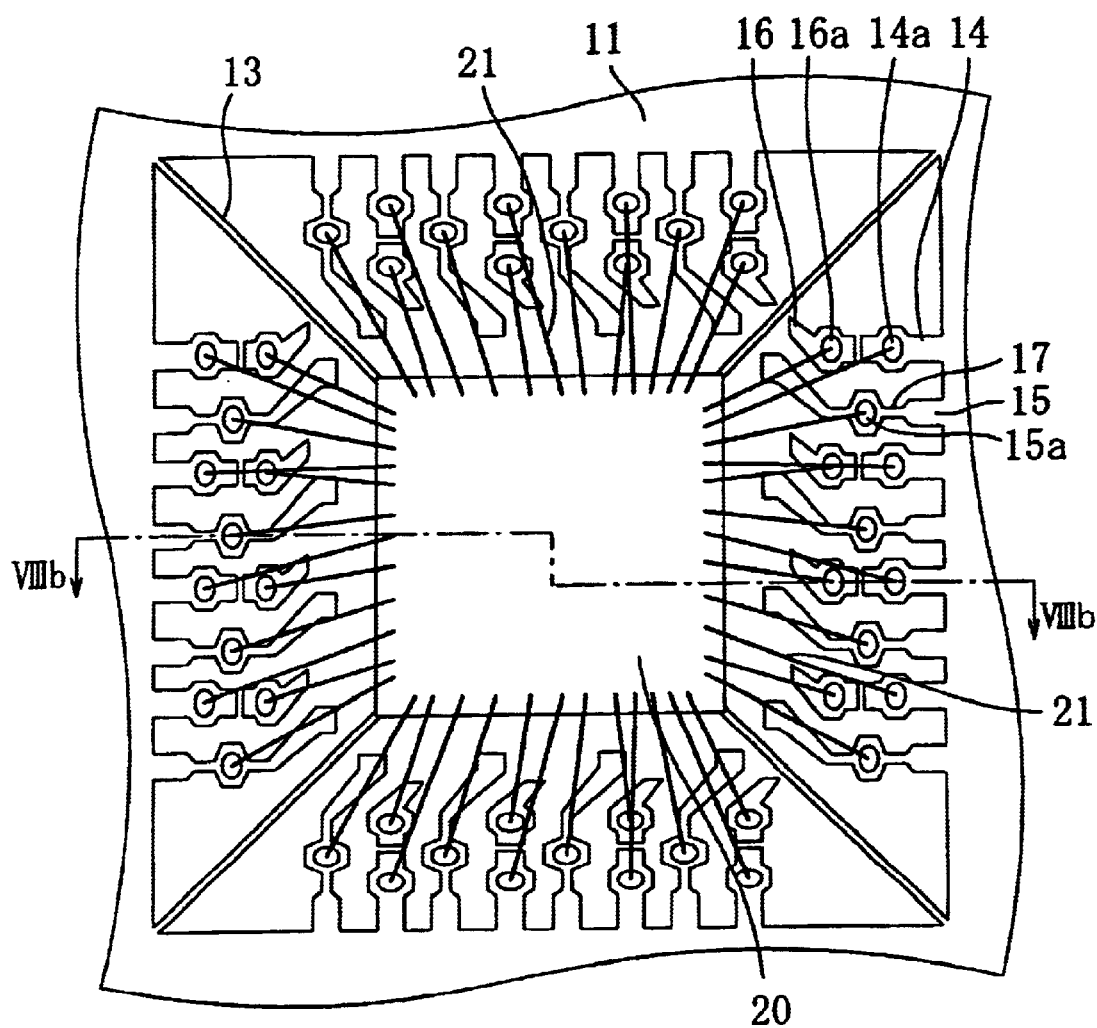
FIGS. 8A and 8B are a plan view and a cross-sectional view taken along line VIII—VIII, respectively, illustrating the wire bonding step according to an embodiment of the present invention.
Figure 8B:
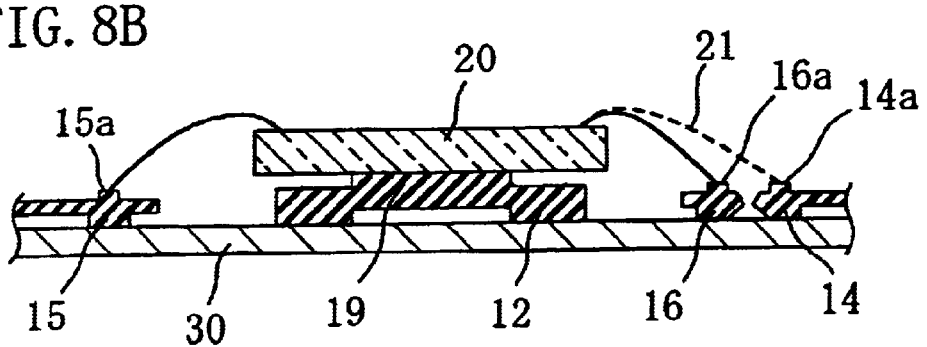

FIGS. 8A and 8B are a plan view and a cross-sectional view taken along line VIII—VIII, respectively, illustrating the wire bonding step. In the step of FIGS. 8A and 8B, electrodes of the semiconductor chip 20, which has been mounted on the die pad 12, are electrically connected to the first to third bonding pads 14a to 16a of the lead frame via the thin metal wires 21 while the lead frame is attached to the encapsulation sheet 30.

Figure 9A:
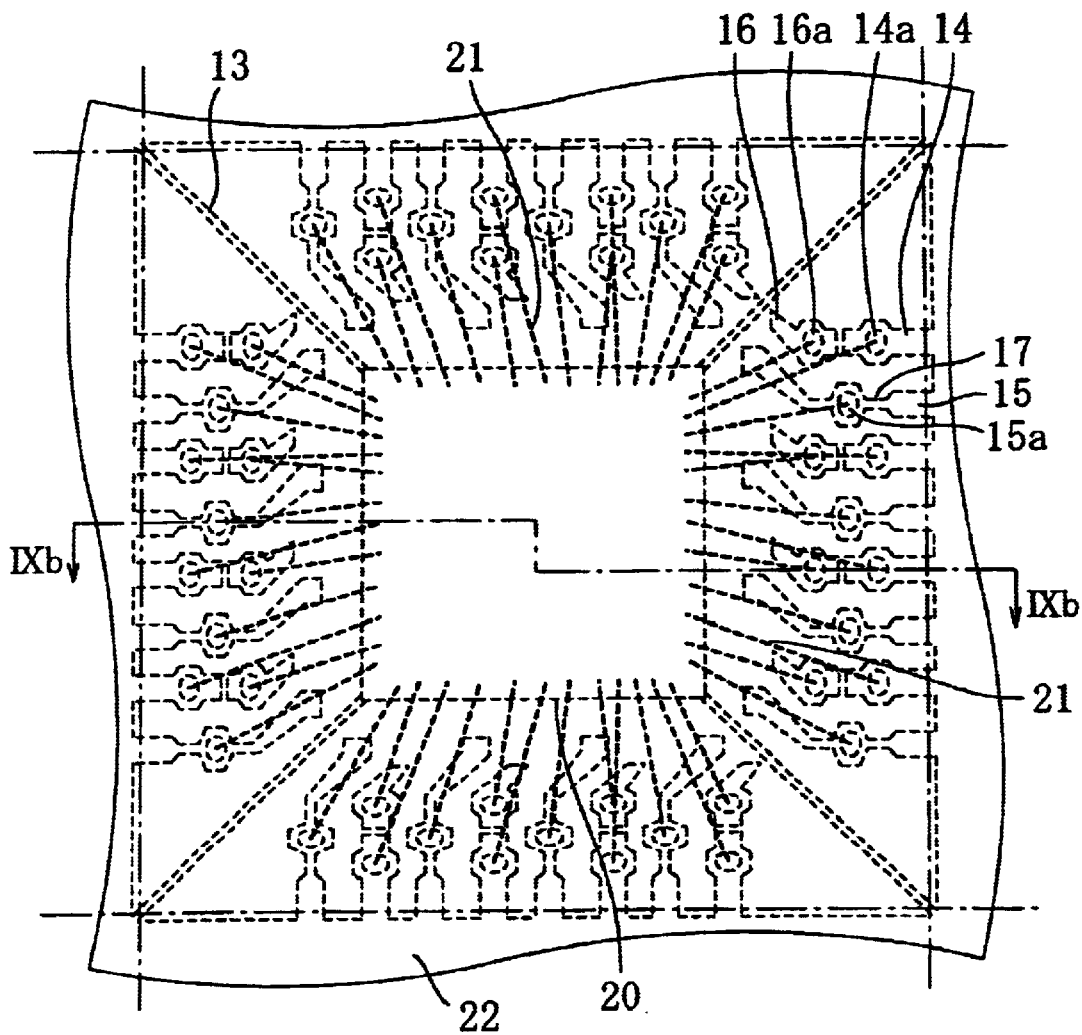
FIGS. 9A and 9B are a plan view and a cross-sectional view taken along line IX—IX, respectively, illustrating the resin encapsulation step according to an embodiment of the present invention.
Figure 9B:
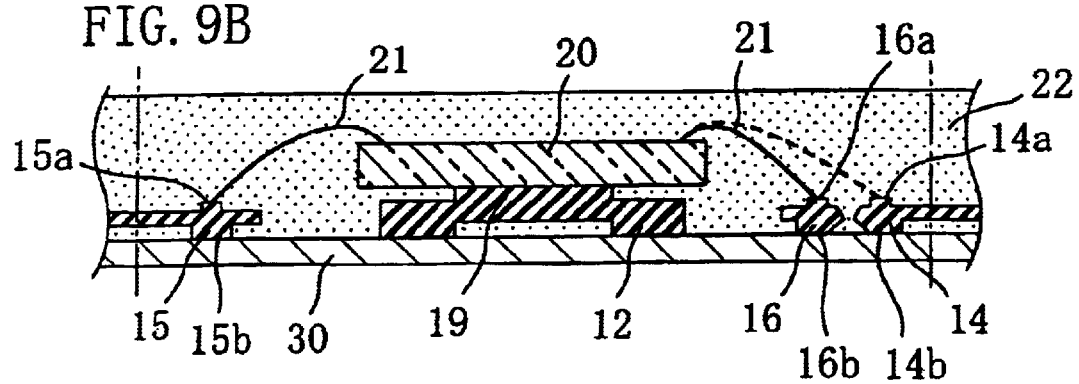

FIGS. 9A and 9B are a plan view and a cross-sectional view taken along line IX—IX, respectively, illustrating the resin encapsulation step. In the step of FIGS. 9A and 9B, the entire area of the upper surface of the lead frame is encapsulated by the encapsulation resin 22 in a single process while the lead frame is attached to the encapsulation sheet 30. In FIG. 9A, components that are encapsulated in the encapsulation resin 22 are illustrated by broken lines. Moreover, in FIGS. 9A and 9B, each cut line (dicing line) along which the lead frame is cut into individual resin-encapsulated semiconductor devices (packages) in a subsequent step is illustrated by a one-dot chain line.

Figure 10A:
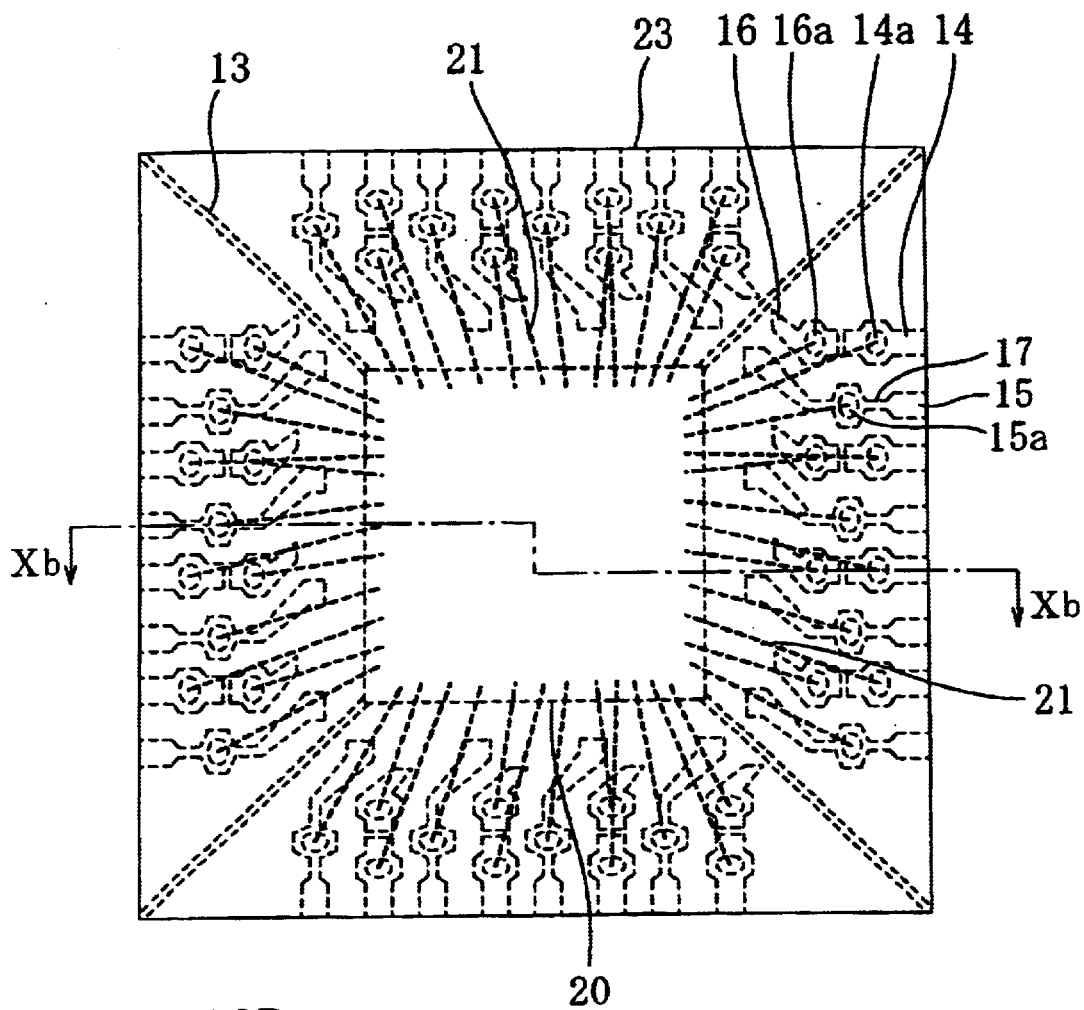
FIGS. 10A and 10B are a plan view and a cross-sectional view taken along line X—X, respectively, illustrating the dicing step according to an embodiment of the present invention.
Figure 10B:
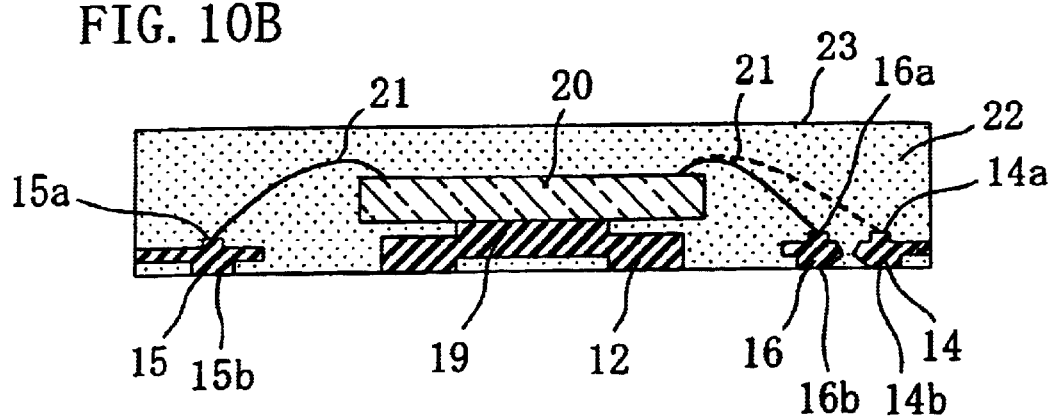
Figure 11:
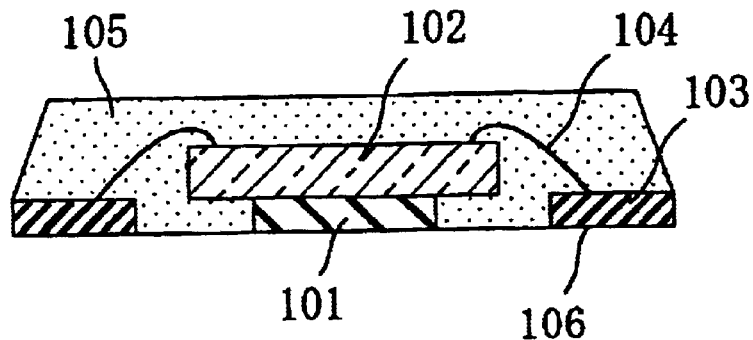
FIG. 11 is a cross-sectional view illustrating a conventional QFN type resin-encapsulated semiconductor device.
Figure 12:
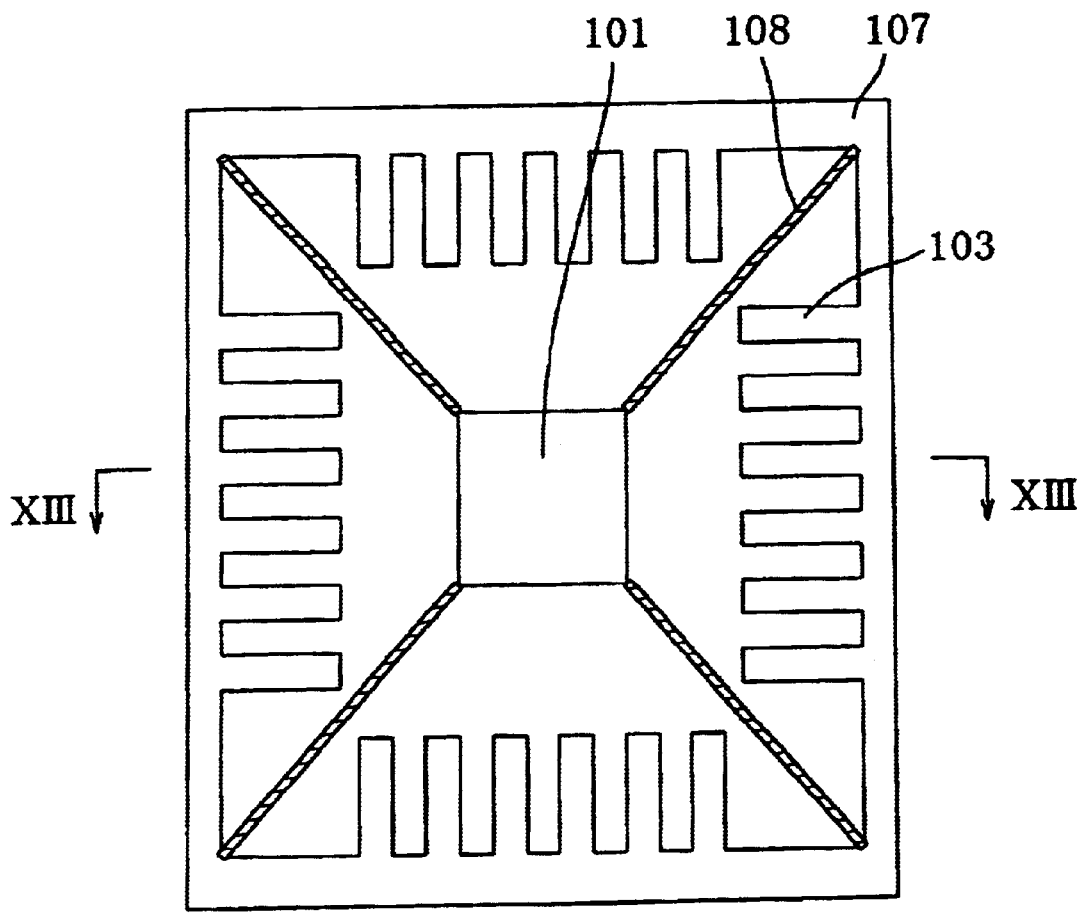
FIG. 12 is a plan view illustrating a lead frame used in a conventional QFN type resin-encapsulated semiconductor device
Figure 13A:
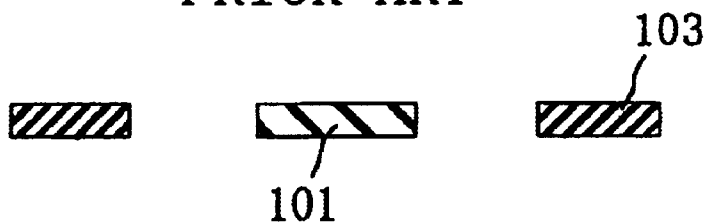
FIGS. 13A, 13B, 13C and 13D are cross-sectional views taken along line XIII—XIII of FIG. 12, illustrating a process of manufacturing a conventional QFN type resin-encapsulated semiconductor device.
Figure 13B:
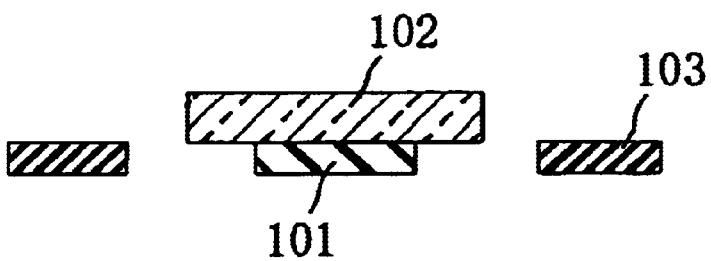
Figure 13C:
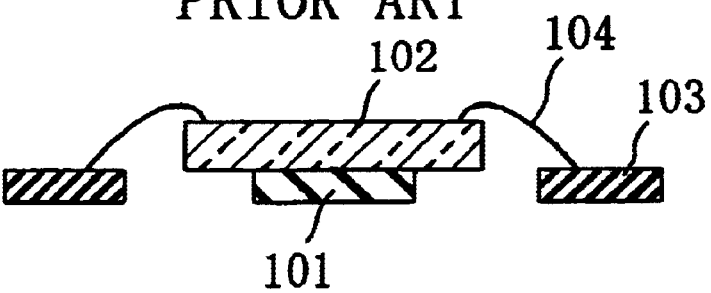
Figure 13D:
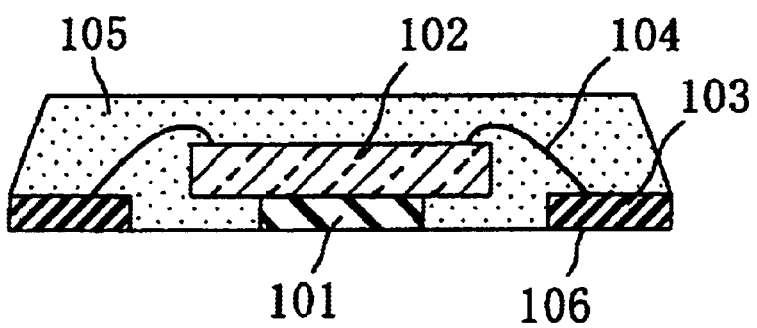
Figure 14A:
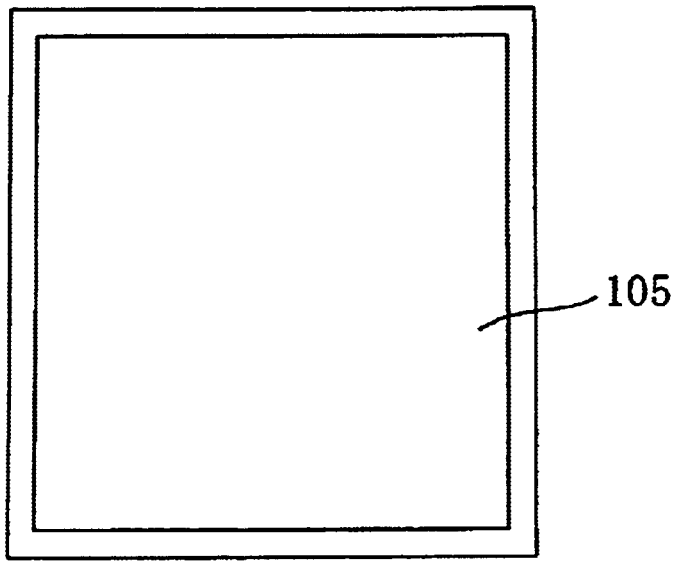
FIGS. 14A, 14B and 14C are a top view, a bottom view and a cross-sectional view taken along line XIVc—XIVc, respectively, illustrating a conventional LGA type resin-encapsulated semiconductor device.
Figure 14B:
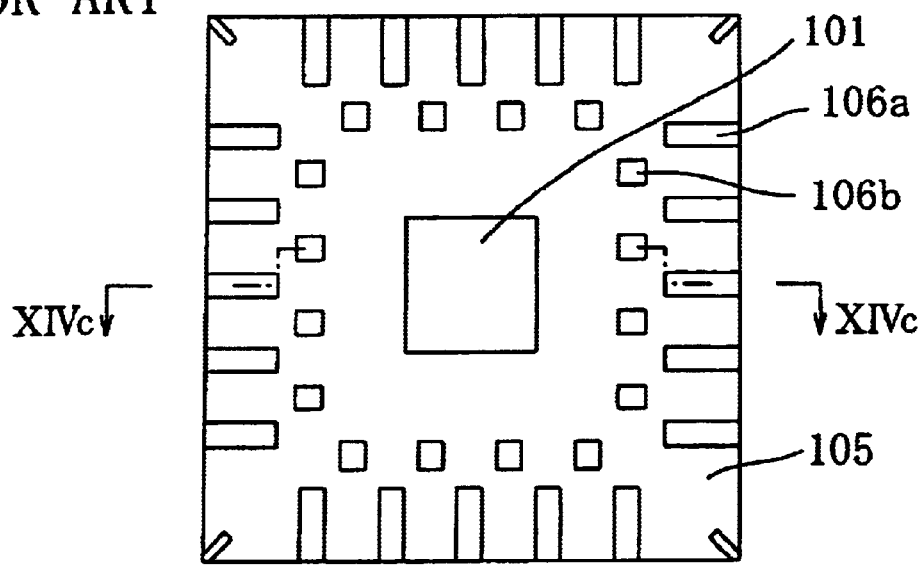
Figure 14C:
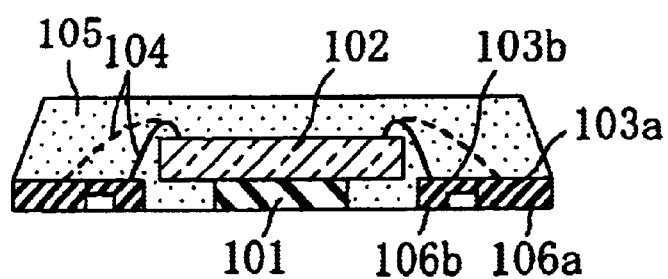
Figure 15:
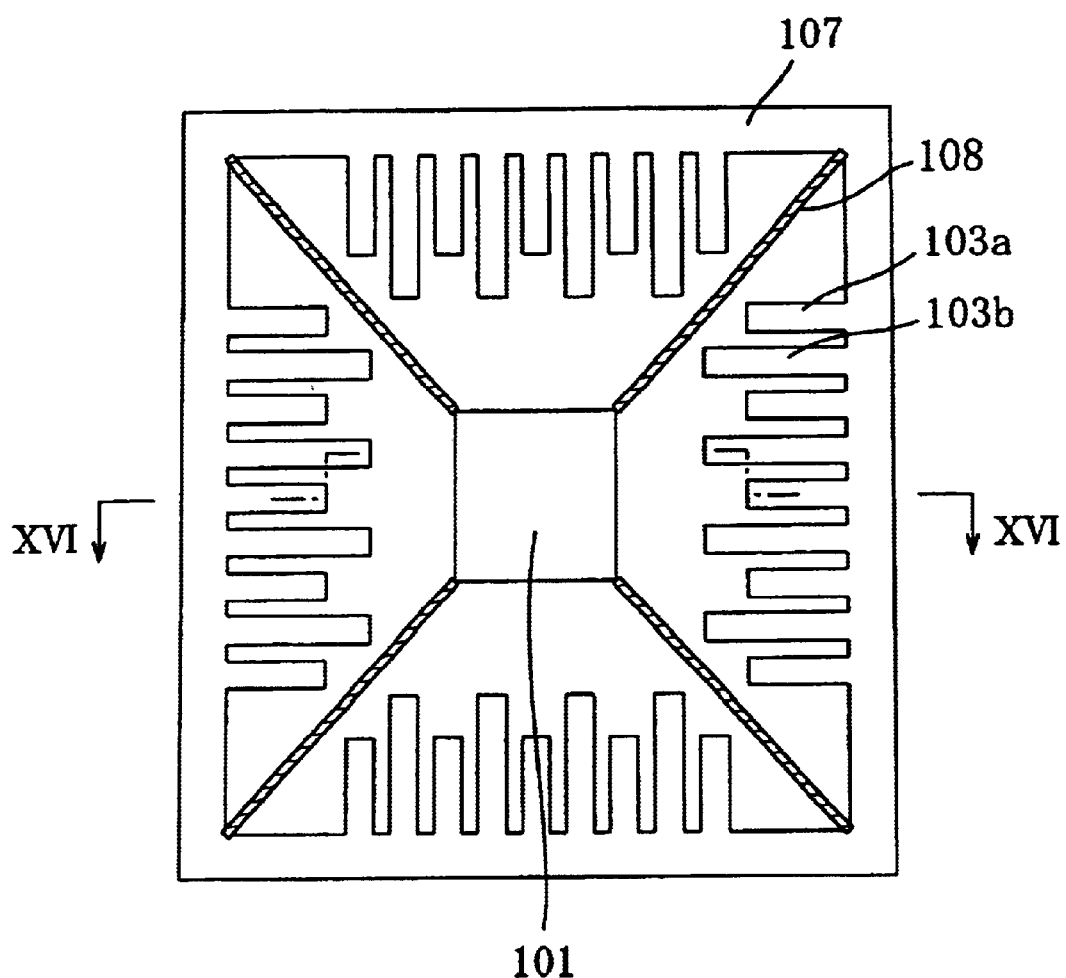
FIG. 15 is a plan view illustrating a lead frame used in a conventional LGA type resin-encapsulated semiconductor device.
Figure 16A:
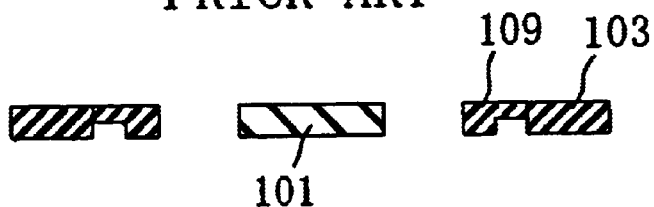
FIGS. 16A, 16B, 16C and 16D are cross-sectional views taken along line XVI—XVI of FIG. 15, illustrating a process of manufacturing a conventional LGA type resin-encapsulated semiconductor device.
Figure 16B:
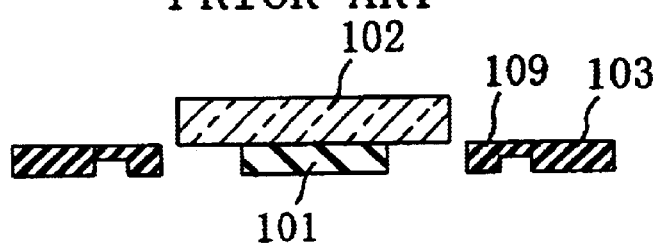
Figure 16C:
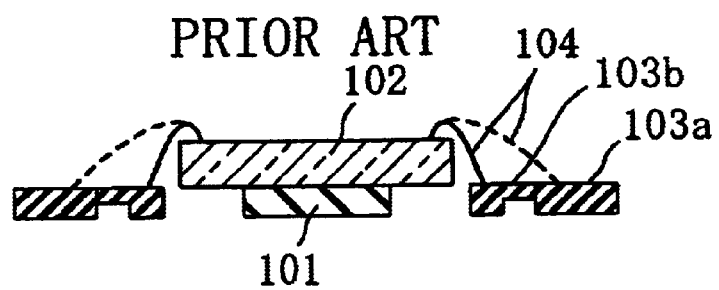
Figure 16D:
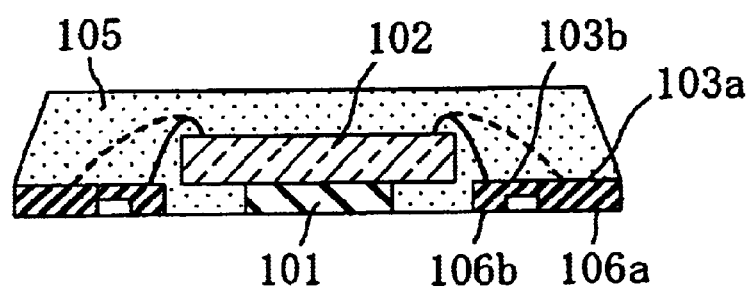

FIGS. 10A and 10B are a plan view and a cross-sectional view taken along line X—X, respectively, illustrating the dicing step. In the step of FIGS. 10A and 10B, the encapsulation sheet 30 attached to the lower surface of the lead frame is removed, and then the lead frame is cut by a rotating blade into individual resin-encapsulated semiconductor devices 23. In this process, the lead frame is cut along a line that is slightly inner than the connecting portion at which the first and second leads 14 and 15 and the suspension leads 13 of the lead frame are connected to the frame body 11 (see FIGS. 4A and 4B).

The method for manufacturing the resin-encapsulated semiconductor device of the present embodiment provides the following advantages. The second lead 15 of the lead frame includes the neck portion 17, whereby the width of the second lead 15 is reduced at the neck portion 17. Therefore, the second lead 15 contacts the encapsulation resin over an increased contact area even if a stress is applied on the leads 14 to 16, thereby causing stripping at the interface between the leads 14 to 16 and the encapsulation resin 22 during the manufacture of a resin-encapsulated semiconductor device using the lead frame (particularly, when the lead frame is cut by a rotating blade). Therefore, it is possible to reduce the thermal stress and the mechanical stress, and to stop the progress of the stripping. In order for the stripping to progress past the neck portion 17, a greater stress is required since the width of the second lead 15 increases from the neck portion 17. Therefore, by providing a neck portion at least in one lead (or leads of one kind) extending from the side surface of the package, the stripping can be suppressed from progressing past the neck portion. While a narrow neck portion is provided only in the second lead 15 in the present embodiment, the narrow neck portion may alternatively be provided also in the first lead 14, which is connected to the side surface of the package.

Furthermore, since the stepped portions 14c to 16c are formed around the bonding pads 14a to 16a, which are provided on the upper surfaces of the leads 14 to 16, respectively, the stepped portions 14c to 16c function to stop the progress of the stripping at the interface between the leads 14 to 16 and the encapsulation resin 22. Therefore, the stepped portions 14c to 16c, together with the neck portion 17 of the second lead 15, provide a synergistic effect of stopping the progress of the stripping between the encapsulation resin and the leads.

Thus, with the lead frame of the present embodiment, the resin-encapsulated semiconductor device using the same and the method for manufacturing the same, since the neck portion 17 having a reduced width is provided in the second lead 15 of the lead frame, it is possible to stop the progress of the stripping between the leads and the encapsulation resin occurring due to a stress applied to the leads in the shaping/dicing step after resin encapsulation, and to realize a resin-encapsulated semiconductor device having a high reliability.

Moreover, since the first and third leads 14 and 16, which are connected to each other when the lead frame is produced, are separated from each other in a subsequent step, it is possible to easily provide three or more rows of external terminals without increasing the number of leads to be connected to the periphery of the opening of the lead frame.

Therefore, while the present embodiment has been described above with respect to a resin-encapsulated semiconductor device in which three rows of external terminals are provided, it is possible to easily produce a resin-encapsulated semiconductor device having four or more rows of external terminals by punching through each of connecting portions connecting together a plurality of sections, which are provided in the form of a single piece upon production of the lead frame, using a punch on an encapsulation sheet as in the above-described embodiment, for example.

In a case where a resin-encapsulated semiconductor device having four or more rows of external terminals is manufactured by a method that includes the step (such as the dicing step) of cutting the leads together with the encapsulation resin using a rotating blade so as to divide the lead frame into individual resin-encapsulated semiconductor devices (packages), stripping is likely to occur between the leads and the encapsulation resin during the dicing step. However, by providing a neck portion having a reduced width (such as the neck portion 17 of the second lead 15) in at least one lead, the progress of the stripping can be suppressed, and it is possible to realize an LGA type resin-encapsulated semiconductor device having a high reliability.

Alternatively, in the lead frame illustrated in FIG. 1, some leads among the second and third leads 15 and 16 may be connected to the die pad 12, so that portions connected to the die pad 12 are punched through in the step of punching through each connecting portion Rcnct between the first and third leads using a punch. In such a case, even if the suspension leads 13 are not provided, the die pad 12 may be connected to the frame body 11 upon production of the lead frame, so that the die pad 12 and the leads 15 or 16 can be separated from each other in a subsequent step.

What is claimed is:

1. A lead frame, comprising:
    a frame body made of a conductive material and including at least one opening for mounting a semiconductor chip;
    a die pad placed in the opening of the frame body; and
    a group of leads extending from the frame body into the opening, the group of leads including at least:
        a first lead connected to the frame body and including a first bonding pad provided on an upper surface of the first lead and a first land provided on a lower surface of the first lead;
        a second lead directly connected to the frame body and including a second bonding pad provided on an upper surface of the second lead and a second land provided on a lower surface of the second lead; and
        a third lead connected to the first lead and including a third bonding pad provided on an upper surface of the third lead and a third land provided on a lower surface of the third lead,
    wherein an array of the second bonding pad is between an array of the first bonding pad and an array of the third bonding pad,
    wherein a connecting portion that is thinner than the lead frame body and that can be punched through is provided between the first lead and the third lead.

2. The lead frame of claim 1, wherein at least the second lead includes a neck portion having a smaller width than other portions as viewed in a plan view.

3. The lead frame of claim 1, wherein each lead includes a region around the bonding pad thereof that has a smaller thickness than that of a portion of the lead corresponding to the bonding pad, with a stepped portion being provided between the bonding pad and the region around the bonding pad.

4. The lead frame of claim 1, wherein the first, second and third lands are substantially coplanar on a common plane while being arranged in three rows on the common plane.

5. The lead frame of claim 1, wherein the second lead and a lead structure including the first and third leads are arranged alternately along a periphery of the opening of the frame body.

6. The lead frame of claim 1, wherein the frame body, the die pad and the group of leads are made of a single metal plate.

* * * * *